(12) United States Patent
Finney

(10) Patent No.: US 8,278,890 B2
(45) Date of Patent: Oct. 2, 2012

(54) POWER SUPPLY CIRCUIT

(75) Inventor: Adrian Finney, Osterreich (AT)

(73) Assignee: Zetex Semiconductors PLC, Chadderton, Oldham, Lancashire (GB)

( * ) Notice: Subject to any disclaimer, the term of this patent is extended or adjusted under 35 U.S.C. 154(b) by 650 days.

(21) Appl. No.: 12/376,295

(22) PCT Filed: Aug. 3, 2007

(86) PCT No.: PCT/GB2007/002977
§ 371 (c)(1),
(2), (4) Date: Apr. 28, 2009

(87) PCT Pub. No.: WO2008/015462
PCT Pub. Date: Feb. 7, 2008

(65) Prior Publication Data
US 2010/0237847 A1    Sep. 23, 2010

(30) Foreign Application Priority Data
Aug. 4, 2006 (GB) .................................. 0615493.4

(51) Int. Cl.
*G05F 1/00* (2006.01)
(52) U.S. Cl. ........................................................ 323/271
(58) Field of Classification Search .................. 323/271, 323/311; 257/327–346
See application file for complete search history.

(56) References Cited

U.S. PATENT DOCUMENTS

| | | | |
|---|---|---|---|
| 4,631,565 A | 12/1986 | Tihanyi | |
| 5,049,805 A | 9/1991 | Celenza et al. | |
| 5,666,043 A | 9/1997 | Henry et al. | |
| 5,760,613 A | 6/1998 | Pulvirenti et al. | |
| 6,377,428 B1 * | 4/2002 | Ogasawara | 361/86 |
| 6,525,515 B1 | 2/2003 | Ngo et al. | |

(Continued)

FOREIGN PATENT DOCUMENTS

| | | |
|---|---|---|
| EP | 0419093 | 3/1991 |
| JP | 58222555 | 6/1982 |

OTHER PUBLICATIONS

PCT International Search Report for PCT/GB2007/002977, Mar. 7, 2008, 6 pages.

(Continued)

*Primary Examiner* — Adolf Berhane
*Assistant Examiner* — Yemane Mehari
(74) *Attorney, Agent, or Firm* — Reising Ethington P.C.

(57) ABSTRACT

A power supply circuit has a first MOSFET having a body region between the source and drain. The body region is connected so as to be at the same potential as the source. Application of a suitable potential to the gate causes the MOSFET to switch to a conductive on state. The power supply circuit also has signal generation circuitry, which generates a signal indicative of a conductive state of the first MOSFET. The signal generation circuitry generates a reference voltage of a predetermined potential difference from the source potential. The power supply circuit further comprises a second MOSFET having a body region connected so as to be at the same potential as the drain of the first MOSFET, and the second gate is connected to receive the reference voltage. When the potential of the drain of the first MOSFET falls a predetermined voltage below the reference voltage the second MOSFET is switched to a conductive on state between the second source and the second drain, the signal being dependent upon the state of the second MOSFET.

24 Claims, 4 Drawing Sheets

U.S. PATENT DOCUMENTS

2002/0093094 A1  7/2002  Takagawa et al.

OTHER PUBLICATIONS

PCT Written Opinion for PCT/GB2007/002977, Mar. 7, 2008, 8 pages.

UK Examination Report for application No. GB0615493.4, dated Feb. 11, 2011, 2 pages.
UK Search Report under Section 17 for GB0615493.4, Oct. 25, 2006, 1 page.
UK Search Report under Section 17(5) for GB0615493.4, Oct. 25, 2006, 2 pages.

* cited by examiner

POWER SUPPLY CIRCUIT

FIELD OF THE INVENTION

The present invention relates to power supply circuits and in particular, although not exclusively, to power supply circuits for Power Over Ethernet (POE) applications in which electrical power may be transmitted, along with data, to remote devices over standard cables (e.g. twisted pairs) in an Ethernet network.

BACKGROUND TO THE INVENTION

For a number of applications in which a power supply powers a connected device it is desirable for the power supply to provide a "power good" signal to the connected device to inform the device that the power supply is working correctly and is generating the correct voltage or voltages that the device requires in order to operate. This is because the power supply may take some time after initial start-up to establish proper operation. For example, the power supply may need to charge a line capacitance before it is capable of supplying a load. If the connected device were to begin operating before receiving the power good signal, the supply voltages could be incorrect, and this could lead to device malfunction. This is especially a problem where the device is a Power Over Ethernet Powered Device (POE PD) and connected to receive DC power over an Ethernet connection. By waiting for the power good signal from the supply before beginning to operate, this problem is largely eliminated.

It is known to supply power to a connected device by means of power supply rails incorporating a series connected vertical power MOSFET. The source and drain of the power MOSFET are connected in series with one of the rails, and by controlling the potential applied to the MOSFET gate the MOSFET can be switched between a conducting and a non-conducting state. Thus, the power MOSFET forms a controllable interrupt. For POE applications the potential between the power supply rails may be in excess of 30V, for example 48V, and in its off state the power MOSFET needs to withstand this voltage across its source and drain. A problem in such applications is how to generate a power good signal that is a good indicator of the power supply being ready to supply power to a load.

SUMMARY OF THE INVENTION

According to a first aspect of the present invention there is provided a power supply circuit comprising:
a first power supply rail;
a second power supply rail;
a first MOSFET having a gate, a source, a drain, and a body region between the source and drain, the body region being connected so as to be at the same potential as the source, and the source and drain being connected in series with the second power supply rail, the arrangement being such that application of a suitable potential to the gate is able to switch the MOSFET to an on state in which a conductive channel is opened in the body region between the source and drain to carry a power supply current through the first MOSFET; and
signal generation circuitry arranged to generate a signal indicative of a conductive state of the first MOSFET,
the signal generation circuitry comprising reference voltage generation means connected to said source and arranged to generate a reference voltage, said reference voltage being a predetermined potential difference from the source potential, and a second MOSFET having a second gate, a second source, a second drain, and a second body region between the second source and second drain, the second body region being connected so as to be at the same potential as the drain of the first MOSFET, and the second gate being connected to receive said reference voltage, the arrangement being such that when the potential of the drain of the first MOSFET falls a predetermined voltage (e.g. a threshold voltage, or a threshold voltage plus some other component, such as a diode drop) below the reference voltage the second MOSFET is switched to an on state in which a second conductive channel is opened in the second body region between the second source and the second drain, the signal being dependent upon the state of the second MOSFET.

For example, the signal (which may be described as a power good signal) may simply be the potential between the source and drain of the second MOSFET. Alternatively, the second MOSFET may be used to switch a further device (e.g. a further MOSFET) and the signal may be a potential at some other point, or a potential between some other points, in the signal generation circuitry. For example, the signal may be the potential across the source and drain of the further MOSFET.

In this first aspect of the invention, appropriate arrangement of the reference voltage generation means can thus ensure that the second MOSFET is only switched to its on state when the first MOSFET (which is, in effect, the power control element) is fully (or sufficiently fully) conducting. As the signal is dependent upon the state of the second MOSFET, the signal can thus be used as an indication of when the first MOSFET is fully on. By being dependent upon the potential between the source and drain of the first MOSFET, the power good signal is thus a good, reliable indicator of the correct operation (and on state) of the first MOSFET and hence the circuit's readiness to supply power to a connected load. Also, by arranging the body of the second MOSFET so as to be at the potential of the drain of the first MOSFET, the second MOSFET may be a low voltage, lateral device, even if the first MOSFET is a high voltage power MOSFET. Thus, in embodiments of the invention, the power good signal can be provided without requiring the added complexity and cost of further high voltage devices in addition to a power MOSFET. In embodiments of the invention, providing a power good signal referenced to the first MOSFET's drain provides the further advantage that the signal generation circuitry need not comprise the external level shifting circuitry that would be necessary if the power good signal were referenced to the source of a power MOSFET.

In certain embodiments, the signal generation circuitry is connected to the first power supply rail, and the signal is dependent upon the potential on the first supply rail in addition to the conductive state of the first MOSFET. By being dependent upon both these factors, the signal is thus an even more reliable indicator of the power supply circuit's readiness to supply power to a connected device (load).

As mentioned above, in certain embodiments the first MOSFET is a vertical power MOSFET comprising a semiconductor structure having an upper surface and a lower surface, the source of the first MOSFET comprising a conductive contact to the upper surface and the drain of the first MOSFET comprising a conductive contact to the lower surface.

In certain embodiments the second MOSFET is a lateral MOSFET comprising a second semiconductor structure having an upper surface and a lower surface, the source and the drain of the second MOSFET each comprising a respective conductive contact to the upper surface of the second semiconductor structure.

In certain embodiments the first and second MOSFETS are integrated on a common substrate. The common substrate may have an upper surface and a lower surface and may comprise:

a relatively highly doped semiconductor substrate of a first conductivity type, a lower surface of the semiconductor substrate being the lower surface of the common substrate;

an epitaxial layer of relatively less highly doped semiconductor material of the first conductivity type formed on the semiconductor substrate;

a first well of semiconductor material of a second conductivity type extending from the upper surface of the common substrate into the epitaxial layer;

a second well of semiconductor material of said second conductivity type extending from the upper surface of the common substrate into the epitaxial layer, said second well being separate from said first well;

wherein the first MOSFET is a vertical power MOSFET, the source of the first MOSFET comprising a conductive contact to the upper surface of the common substrate arranged to contact the first well and at least one source region of semiconductor material of said first conductivity type extending from the upper surface into the first well, the drain of the first MOSFET comprising a conductive contact to the lower surface of the semiconductor substrate, and the body region of the first MOSFET comprising at least a portion of the first well;

and wherein the second MOSFET is a lateral MOSFET, the source of the second MOSFET comprising a conductive contact to the upper surface of the common substrate arranged to contact a second source region of semiconductor material of said first conductivity type extending from the upper surface into the second well, the drain of the second MOSFET comprising a conductive contact to the upper surface of the common substrate arranged to contact a drain region of semiconductor material of said first conductivity type extending from the upper surface into the second well, and wherein the second body region of the second MOSFET comprises at least part of said second well.

In certain embodiments the first well is formed within an off state depletion region of the first MOSFET such that the surrounding semiconductor material of the first conductivity type is substantially at the source potential of the first MOSFET, and the second well is formed outside the off state depletion region of the first MOSFET such that the surrounding semiconductor material of the first conductivity type is substantially at the drain potential of the first MOSFET.

The power supply circuit in certain embodiments comprises a plurality of said first wells and a plurality of said second wells, in which case, the source of the first MOSFET comprises a conductive contact to the upper surface of the common substrate arranged to contact at least one of the first wells and at least one source region of semiconductor material of said first conductivity type extending from the upper surface into a respective one of the first wells. The body region of the first MOSFET then comprises at least a portion of at least one of the first wells. Similarly, the source of the second MOSFET comprises a conductive contact to the upper surface of the common substrate arranged to contact a second source region of semiconductor material of said first conductivity type extending from the upper surface into one of the second wells, and the drain of the second MOSFET comprises a conductive contact to the upper surface of the common substrate arranged to contact a drain region of semiconductor material of said first conductivity type extending from the upper surface into the same one of the second wells. The second body region of the second MOSFET then comprises at least part of the same one of the second wells.

Certain embodiments further comprise a termination structure arranged to prevent formation of a conductive channel between the first and second wells.

The termination structure may comprise a channel stop region of semiconductor material of said first conductivity type extending from the upper surface of the common substrate into the epitaxial layer and arranged so as to separate (i.e. arranged between) the first and second wells. In embodiments comprising a plurality of first wells and a plurality of second wells the channel stop region is arranged to separate the plurality of first wells from the plurality of second wells.

In certain embodiments, the circuit further comprises a short arranged to electrically connect the channel stop region to the second well (or to at least one of the plurality of second wells).

The termination structure may comprise a field plate arranged over the upper surface of the common substrate so as to overlap an edge portion of the first well (or an edge portion of at least one of the plurality of first wells).

In certain embodiments the circuit further comprises gate control circuitry arranged to control the potential applied to the gate of the first MOSFET, the gate control circuitry comprising at least one gate control MOSFET integrated on said common substrate, said gate control MOSFET being a lateral MOSFET comprising a gate, a source, a drain, and a body region between the source and drain, the source of the gate control MOSFET comprising a conductive contact to the upper surface of the common substrate arranged to contact a respective source region of semiconductor material of said first conductivity type extending from the upper surface into the first well, the drain of the gate control MOSFET comprising a conductive contact to the upper surface of the common substrate arranged to contact a respective drain region of semiconductor material of said first conductivity type extending from the upper surface into the first well, and wherein the body region of the gate control MOSFET comprises a portion of said first well or a portion of one of said plurality of first wells.

In certain embodiments the signal generation circuitry comprises at least one further lateral MOSFET having a body region connected so as to be at the same potential as the drain of the first MOSFET.

The or each further lateral MOSFET may be integrated on the common substrate, and the body region of the or each further lateral MOSFET may comprise a respective portion of the second well or of one of the plurality of second wells.

The at least one further lateral MOSFET may comprise a third MOSFET having a drain connected to the first supply rail via at least one resistor and a source connected so as to be at the potential of the drain of the first MOSFET, the third MOSFET being further connected such that it is switched off in response to the second MOSFET switching on, and wherein said signal is a voltage at the drain of the third MOSFET.

Certain embodiments further comprise a power supply arranged to provide a DC voltage of at least 30V between the first and second power supply rails. The power supply may be incorporated in a server or a computer.

The circuit may further comprise means for connecting an Ethernet cable to the first power supply rail, the drain of the first MOSFET, and to a signal output terminal on which the signal is provided, whereby power and said signal may be provided to a device connected to the circuit via an Ethernet cable.

Another aspect of the invention provides a circuit in accordance with the first aspect, in combination with a device arranged to be powered from the power supply rails, the device being connected to the first power supply rail and to the drain of the first MOSFET such that power supply current is supplied to the device through the first MOSFET, and the device being connected to receive said signal, the device having an operational state in which it draws power supply current from the rails and a non-operational state in which it draws at least reduced current (which may be zero, or substantially zero current) from the rails, the device being arranged so as to be dependent upon said signal to switch from the non-operational to the operation state.

In certain embodiments the device is a DC to DC converter.

Another aspect of the invention provides a method of providing a signal (a power good signal) to a device arranged to be powered from power supply rails via a MOSFET, said signal being indicative of a conductive state of the MOSFET (e.g. that the MOSFET is capable of supplying the load), the method comprising the steps of:

monitoring a potential difference between the source and drain of the MOSFET; and generating said signal according to said potential difference.

Thus, the signal is indicative of a state of the MOSFET, and this signal may be indicative of the MOSFET being in a state in which it is capable of supplying the load (i.e. a connected device or devices).

Again, this aspect provides the advantage that, as the "power good" signal is dependent upon the potential across the first MOSFET's source and drain (which is in turn dependent upon the channel resistance), the signal is a good and reliable indicator of the power supply's readiness to power a load.

In certain embodiments the step of generating said signal comprises:

generating a reference voltage, said reference voltage being a predetermined potential difference from the source potential of the MOSFET;

applying said reference voltage to the gate of a second MOSFET having a second gate, a second source, a second drain, and a second body region between the second source and second drain;

connecting the second body region so as to be at the same potential as the drain of the first MOSFET, such that when the potential of the drain of the first MOSFET falls a predetermined voltage (e.g. a threshold voltage, or a threshold voltage plus some other component, such as a diode drop) below the reference voltage the second MOSFET is switched to an on state in which a second conductive channel is opened in the second body region between the second source and the second drain; and using the state of the second MOSFET to determine said signal.

In certain embodiments, the signal is dependent upon both the potential across the first MOSFET's source and drain and the potential between the supply rails. Yet another aspect of the invention provides an integrated circuit comprising:

a common substrate having an upper surface and a lower surface and comprising a relatively highly doped semiconductor substrate of a first conductivity type, a lower surface of the semiconductor substrate being the lower surface of the common substrate, and an epitaxial layer of relatively less highly doped semiconductor material of the first conductivity type formed on the semiconductor substrate;

a first well of semiconductor material of a second conductivity type extending from the upper surface of the common substrate into the epitaxial layer;

a second well of semiconductor material of said second conductivity type extending from the upper surface of the common substrate into the epitaxial layer, said second well being separate from said first well;

a first MOSFET having a gate, a source, a drain, and a body region between the source and drain, the body region being connected so as to be at the same potential as the source;

a second MOSFET having a second gate, a second source, a second drain, and a second body region between the second source and second drain, the second body region being connected so as to be at the same potential as the drain of the first MOSFET, wherein the first MOSFET is a vertical power MOSFET, the source of the first MOSFET comprising a conductive contact to the upper surface of the common substrate arranged to contact the first well and at least one source region of semiconductor material of said first conductivity type extending from the upper surface into the first well, the drain of the first MOSFET comprising a conductive contact to the lower surface of the semiconductor substrate, and the body region of the first MOSFET comprising at least a portion of the first well;

and wherein the second MOSFET is a lateral MOSFET, the source of the second MOSFET comprising a conductive contact to the upper surface of the common substrate arranged to contact a second source region of semiconductor material of said first conductivity type extending from the upper surface into the second well, the drain of the second MOSFET comprising a conductive contact to the upper surface of the common substrate arranged to contact a drain region of semiconductor material of said first conductivity type extending from the upper surface into the second well, and wherein the second body region of the second MOSFET comprises at least part of said second well.

Conveniently, the first well is formed within an off state depletion region of the first MOSFET such that the surrounding semiconductor material of the first conductivity type is substantially at the source potential of the first MOSFET, and the second well is formed outside the off state depletion region of the first MOSFET such that the surrounding semiconductor material of the first conductivity type is substantially at the drain potential of the first MOSFET.

BRIEF DESCRIPTION OF THE DRAWINGS

Embodiments of the invention will now be described with reference to the accompanying drawings of which.

DETAILED DESCRIPTION OF EMBODIMENTS OF THE INVENTION

Figure 1:
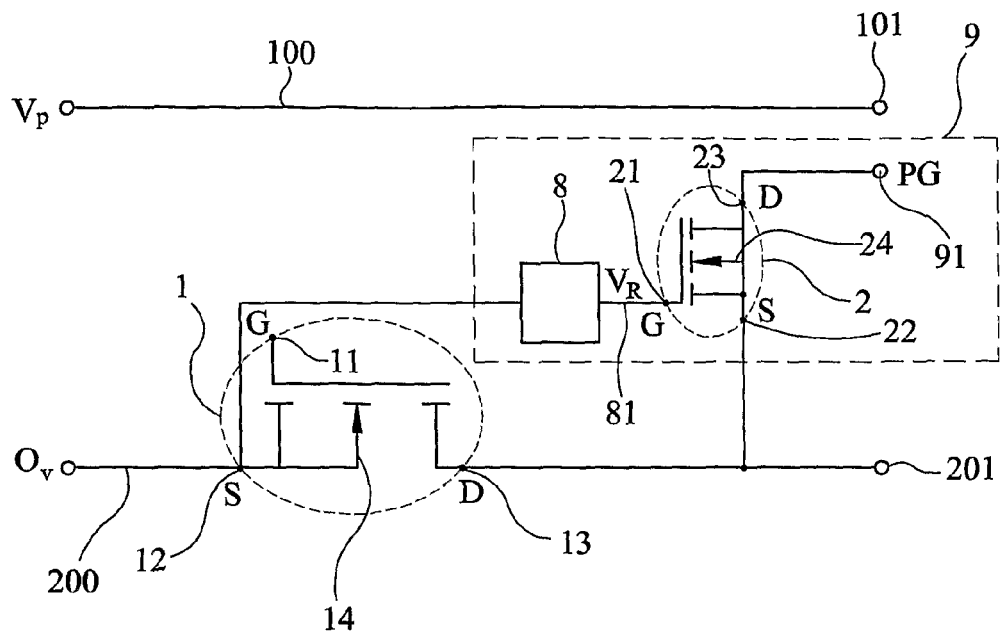
FIG. 1 is a schematic representation of a power supply circuit embodying the invention.

Referring now to FIG. 1, a power supply circuit embodying the invention comprises a first power supply rail 100, to which a supply voltage $V_P$ is applied in use, and a second power supply rail 200, which in use is arranged so as to be at 0V (zero volts). The circuit further comprises a first MOSFET 1 having a gate 11, a source 12, a drain 13, and a body region (not shown in the figure) between the source and drain. The body region is connected so as to be at the same potential as the source 12. This connection, which may also be referred to as the bulk connection, is denoted by reference numeral 14 in the figure. In this particular example the first MOSFET is an enhancement mode device, and hence if no potential is applied to the gate 11 relative to the bulk there is no conductive channel between the source and drain. If, however, a suitable potential is applied to the gate 11 then the body region material is inverted under the gate and a conductive channel between the source and drain is provided. In this first embodiment, the source and drain are connected in series with the second power supply rail 200 so that power supplied from the rails to a device connected to the terminals 101, 201 is through the MOSFET 1, i.e., the power supply current is through the MOSFET 1. Thus, the MOSFET 1 can be regarded as a controllable interrupt in one of the power supply rails. The power supply circuit includes a "power good" signal generation circuitry arranged to generate a so-called power good signal that is indicative of the conductive state of the first MOSFET 1. This signal generation circuitry 9 comprises a reference voltage generation means 8 connected to the source 12 of the first MOSFET and arranged to generate a reference voltage $V_R$ 81, this reference voltage being a predetermined potential difference from the source potential. Signal generation circuitry 9 also includes a second MOSFET 2 having a second gate 21, a second source 22, a second drain 23 and a second body region between the second source and second drain. The second body region is connected so as to be at the same potential as the drain 13 of the first MOSFET 1, and in this example the second body region is also at the same potential as the source 22 of the second MOSFET. This bulk connection for the second MOSFET is denoted by reference number 24. Again, in this example the second MOSFET is also an enhancement mode device. In this example, the power good signal indicative of the conductive state of the first MOSFET 1 is simply the output voltage on signal output terminal 91 relative to the MOSFET drain potential on terminal 201. Signal output terminal 91 is connected directly to the drain 23 of the second MOSFET 2. It will also be appreciated that in the example of FIG. 1, in addition to being enhancement mode devices, both the first and second MOSFETs have n-type conductive channels. In alternative embodiments, however, different types of MOSFET may be used. Operation of the power supply is as follows. Consider the situation where a device to be powered is connected to terminals 101 and 201 and the first power supply rail 100 is supplied with voltage $V_P$, say in excess of 30 volts, and the second power supply rail 200 is at 0 volts. If MOSFET 1 is in the off state then the potential at its drain 13 will be high relative to the potential at its source 12 (indeed, the off state drain potential 13 may be $V_P$). The reference voltage generator 8 is arranged such that the reference voltage 81 is just a few volts above source potential 12, e.g. 5 volts. Thus, when the first MOSFET 1 is in the off state, the gate voltage at the gate 21 of the second MOSFET 2 is lower than the potential of the body region of the second MOSFET (which is at the potential of the drain 13 of the first MOSFET 1), hence the second MOSFET is also in an off (non-conducting) state and the potential on signal output terminal 91 is open circuit relative to terminal 201. Then, if a suitable potential is applied to the gate 11 of MOSFET 1 to form a conductive channel between its source and drain, MOSFET 1 switches on. MOSFET 1 is fully switched on when its drain potential is within a few volts of its source potential. In other words, as MOSFET 1 is switched on and the resistance of its conducting channel reduces, the potential at its drain 13 falls, and is closer to the potential of its source 12. The reference voltage applied to the gate of the second MOSFET 2 is still that fixed potential difference from the first MOSFET's source potential, but the potential of its body region falls with the potential of the first MOSFET's drain. The second MOSFET has a threshold voltage which can be defined as the minimum gate bias relative to the body region required to form a conducting channel between the source 22 and drain 23 regions. Thus, there comes a point when the first MOSFET 1 is sufficiently switched on that the potential at its drain 13 has fallen the threshold voltage below the reference voltage, in which case the second MOSFET 2 switches to an on state, with a conducting channel between its source and drain. When this occurs, the potential on the power good signal output terminal 91 falls to substantially the same potential as that on terminal 201. In other words, when the power MOSFET is fully on the voltage between power good signal output terminal 91 and terminal 201 is close to 0 volts. Thus the potential on power good signal output terminal 91 relative to the drain 13 of the first MOSFET is a signal that is indicative of the conductive state of the first MOSFET and can be used by a connected device as an indication that the power supply circuit is ready, in the sense that the load may now draw current from the power supply.

Although the embodiment of FIG. 1 has the first rail 100 at supply potential Vp and the second rail 200 at zero volts, it will be appreciated that in alternative embodiments the potentials applied to the two rails 100, 200 may be different. For example, the first rail may be nominally at zero volts, with the second rail at a supply potential. The supply potential may be positive with respect to ground, or may be negative. In certain embodiments, neither rail may be at zero volts, instead both being at a potential with respect to ground. In certain POE applications, for example, the first rail 100 is arranged so as to be substantially at zero volts, and the second rail is at −48 V. These values are merely examples, however, and it will be appreciated that the potentials provided on the rails may be selected to suit requirements in particular applications.

Figure 2:
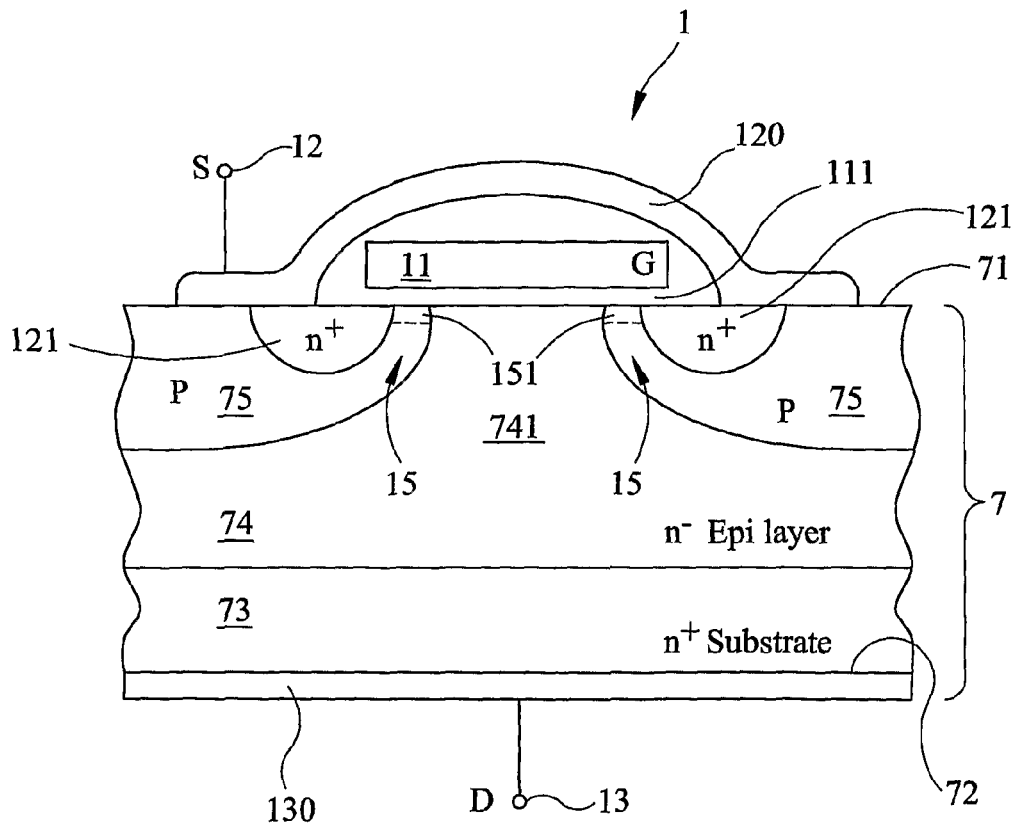
FIG. 2 is a schematic cross section of a vertical power MOSFET used in embodiments of the invention.

Referring now to FIG. 2, in certain embodiments the first MOSFET is a vertical power MOSFET comprising a semiconductor 7 structure having an upper surface 71 and a lower surface 72, the source 12 of the first MOSFET comprising a conductive contact 120 to the upper surface 71, and the drain 13 of the first MOSFET comprising a conductive contact 130 to the lower surface 72. In the example shown in FIG. 2, the semiconductor structure 7 comprises a relatively highly doped semiconductor substrate 73 of a first conductivity type (in this case n) and a lower surface of this substrate 73 forms the surface of the semiconductor structure. The structure also comprises an epitaxial layer 74 of relatively less highly doped semiconductor material of the same first conductivity type formed on the semiconductor substrate 73. The vertical power MOSFET comprises a well 75 of semiconductor material of a second conductivity type (in this example p-type) extending from the upper surface 71 down into the epitaxial layer 74. In the figure, the well 75 is shown in two parts but it will be appreciated that in alternative embodiments the well 75 may comprise just a single, continuous region, or indeed may comprise a plurality of individual regions. As mentioned above, the source of the vertical power MOSFET comprises a conductive contact 120 to the upper surface 71 and this conductive contact is arranged to contact the first well 75 and at least one source region 121 of semiconductor material of the first conductivity type. These source regions 121 extend from the upper surface 71 down into the first well 75. In the centre of the device in FIG. 2 the epitaxial layer 74 extends up to the upper surface 71, beneath the gate electrode 11. The central portion 741 of the epitaxial layer 74 is described as the drift region. The gate electrode 11 is insulated from the upper surface 71 and the conductive material 120 of the source 12 by gate oxide material 111. When no potential is applied to the gate electrode 11 relative to the source potential (which is also the potential of the well material 75) there is no conductive channel through the well material 75 from the source regions 121 of the device to the drain 13. However, when a suitable potential is applied to the gate 11 relative to the source 12 conductive channels 151 are formed in the surface portions of the well 75 under the gate 11, enabling conduction from the source regions 121 into the drift region 741 and thence to the drain 13. Thus, in this vertical device structure the body region 15 of the MOSFET is provided by portions of the first well, those portions being between the source regions 121 and the epitaxial layer 74.

Figure 3:
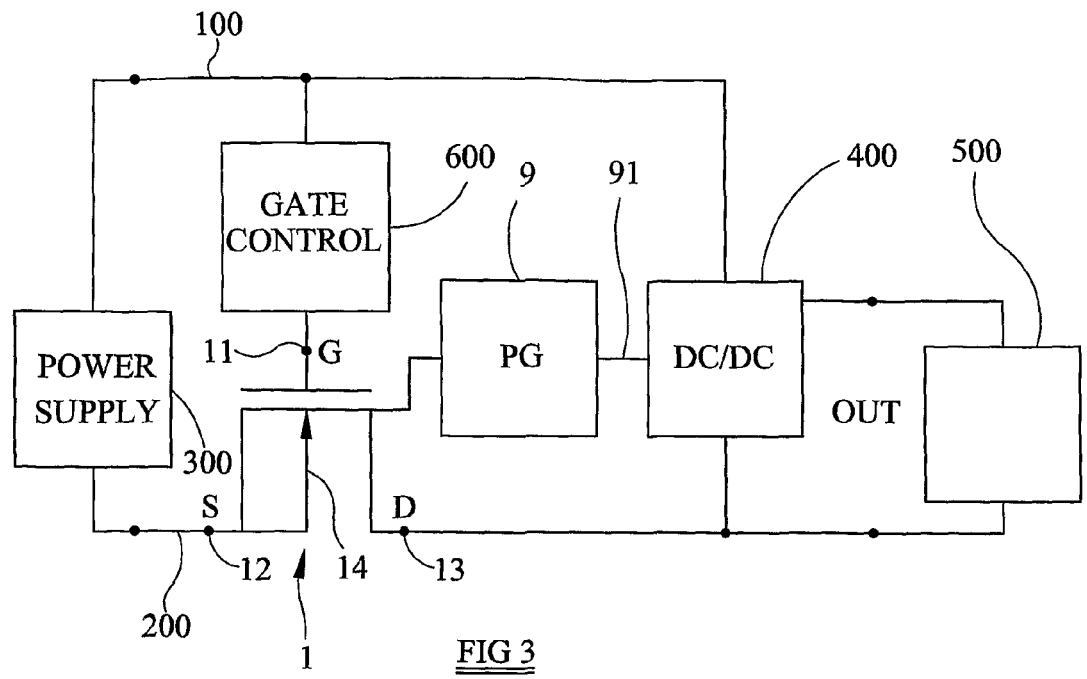
FIG. 3 is a schematic representation of a power supply circuit in combination with powered devices, the combination embodying the present invention.

Referring now to FIG. 3, this shows an embodiment of the invention in which a power supply circuit is connected to power a DC to DC converter 400, which in turn is connected to power a load 500. The power supply circuit comprises a power supply 300 connected to first and second power supply rails 100, 200, and a power MOSFET 1 is arranged such that its source and drain are in series with the second power supply rail 200. Again the body region of the power MOSFET is connected so as to be at source potential. In this embodiment, the power supply circuit further comprises gate control circuitry 600 connected to the first power supply rail 100 and adapted to provide a control voltage to the gate 11 of the power MOSFET to control its conductive state. Power good signal generation circuitry 9 is connected to provide a power good signal 91 relative to the drain 13 of the power MOSFET 1 (although it is not shown in the figure it will be appreciated that the power good signal generation circuitry 9 is also connected to receive the source potential of the power MOSFET). The DC to DC converter 400 is connected between the power supply rails, that is it is connected to the first power supply rail directly and to the second power supply rail 200 via the power MOSFET, and it is also arranged to receive the power good signal 91. In an operational state, the DC to DC converter 400 draws current from the power supply and provides power at a different DC voltage to the connected load 500. However, the DC to DC converter 400 is arranged so that it is responsive to the power good signal 91; only if the power good signal 91 indicates that the power MOSFET is sufficiently conducting will the DC to DC converter switch to its operational mode and draw appreciable current from the power supply. If the signal 91 indicates that the power MOSFET is not yet capable of supplying the load (in effect, not yet sufficiently conducting), the DC to DC converter remains in a substantially non-operational mode in which it draws substantially zero current from the power supply.

Figure 4:
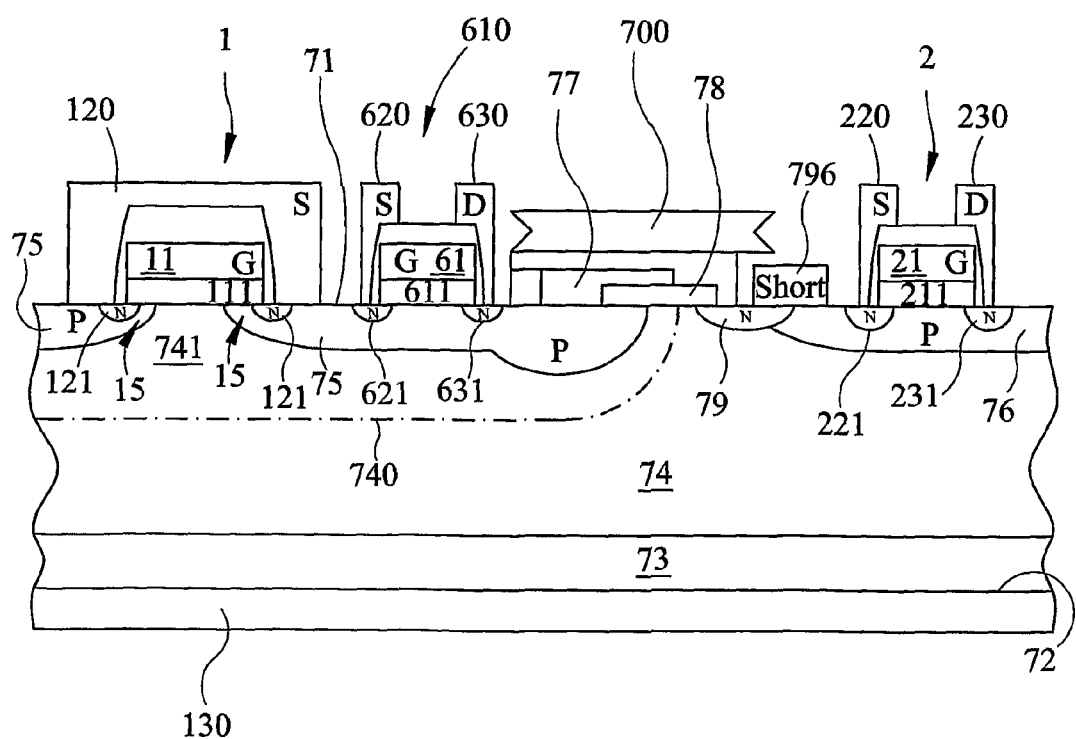
FIG. 4 is a schematic cross section of an integrated circuit embodying the invention.

Referring now to FIG. 4, this is a schematic cross section of part of an intergrated circuit embodying the invention. In the embodiment a first vertical power MOSFET 1 and second lateral MOSFET 2 are integrated on a common substrate. The common substrate has an upper surface 71 and a lower surface 72 to which the drain metal 130 of the power MOSFET 1 is contacted. The body region 15 of the vertical power MOSFET is provided by a portion of a first p-well 75 which extends from the upper surface 71 of the common substrate down into the epitaxial layer 74. The outer edge of the power MOSFET off state depletion region is denoted by broken line 740. A second p-well 76 is provided in the structure, that second p-well 76 also extending from the upper surface 71 down into the epitaxial layer. However the second p-well 76 is separate from the first p-well 75. The first p-well 75 is formed within the off state depletion region 740 of the power MOSFET such that the surrounding semi-conductor material of the first conductivity type (n) is substantially at the source potential of the first MOSFET 1. The second p-well 76 is formed outside the off state depletion region 740 of the first MOSFET 1 such that the surrounding semiconductor material of the first conductivity type is substantially at the drain potential of the first MOSFET 1. The second, lateral MOSFET 2 comprises a source contact 220 arranged in contact with a source region 221 of n-type material extending from the upper surface 71 down into the second p-well 76, drain conductive material 230 arranged in contact with a drain region 231 of n-type material which extends from the upper surface 71 down into the second p-well 76, and a conductive gate 21 insulated from the upper surface 71 by a gate oxide layer 211. The gate is arranged such that when an appropriate potential is applied to it relative to the second p-well 76 a conductive channel is formed between the source region 221 and the drain region 231. This second, lateral MOSFET may be utilised in power good signal generation circuitry 9 as described above, to provide a power good signal indicative of the conductive state of the vertical power MOSFET 1. In such embodiments, a connection is required from the portion of the integrated circuit carrying the vertical power MOSFET to the portion of the integrated circuit carrying the lateral MOSFET 2 in order to provide the second MOSFET 2 with a reference voltage derived from the source potential of the vertical power MOSFET. This connection is indicated in highly schematic fashion by reference number 700, and this can be regarded as representing one or more tracks over a termination structure or region. In the embodiment of FIG. 4 a termination structure is provided and is arranged to prevent formation of a conductive channel between the first p-well 75 and the second p-well 76. In this example, the termination structure comprises a termination field plate 77 which is in contact with, and so is the same potential as, the first p-well 75. This termination field plate 77 overlaps an edge of the first p-well 75, but where it overlaps it is electrically separated from the upper surface 71 by a field oxide layer 78. As will be seen from the figure, the outer edge of the vertical MOSFET off state depletion region comes to the upper surface 71 of the common substrate at a position just beyond the extent of the field plate 77. In this example the termination structure further comprises a channel stop region of n-type material, which is arranged outside the depletion region edge 740. This channel stop region extends from the upper surface 71 down into the epitaxial layer 74. The structure further comprises a short 796 connecting the channel stop region 79 to the second p-well 76. It will be appreciated that the second p-well 76 in the integrated circuit of FIG. 4 is substantially at the same potential as the drain 130 of the vertical power MOSFET 1.

In the embodiment shown in FIG. 4, the integrated circuit comprises an additional lateral MOSFET 610 having a body region provided by a portion of the first p-well 75. This further lateral MOSFET 610 comprises source conductive material 620 connected to a source region 621 of n-type material, and a drain 630 connected to a drain region 631 of n-type material, the source 621 and drain 631 regions extending from the upper surface 71 down into the first p-well 75. The MOSFET 610 also comprises a gate 61 and gate oxide layer 611, and application of a suitable voltage to the gate 61 results in the formation of a conductive channel between source and drain regions 621, 631. The body of the further MOSFET 610 is at the same potential as the source 120 of the vertical power transistor 1 by virtue of the contact between the source conductive material 120 and the surface of the first p-well 75. In certain embodiments, further MOSFET 610 is a gate control MOSFET arranged to control the potential applied to the gate 11 of the power MOSFET 1. The further MOSFET 610 in certain embodiments is a device controlled by protection circuitry to cause a fall in reference voltage in response to a fault condition (as described below, with reference to FIG. 6).

Thus, in the structure shown in FIG. 4 the field plate does not extend all the way from the p well 75 to the n channel stop 79; it stops before it reaches the channel stop diffusion 79. It will be appreciated, however, that the illustrated termination structure is just one example, and there are numerous termination variants which may be used in other embodiments. Such variants include terminations which do not include field plates, or even channel stop diffusions. A common feature of suitable termination structures is, however, that they are able to support the vertical MOSFET off state potential.

Although FIG. 4 has been described as comprising a first p-well 75 and a second p-well 76, in alternative embodiments the integrated circuit may comprise a plurality of first wells, and/or a plurality of second wells. In such examples, each of the first wells is arranged so as to be inside the outer edge of the power MOSFET off state depletion region 740, and each second well is arranged so as to be outside the outer edge of the power MOSFET off state depletion region 740.

Figure 5:
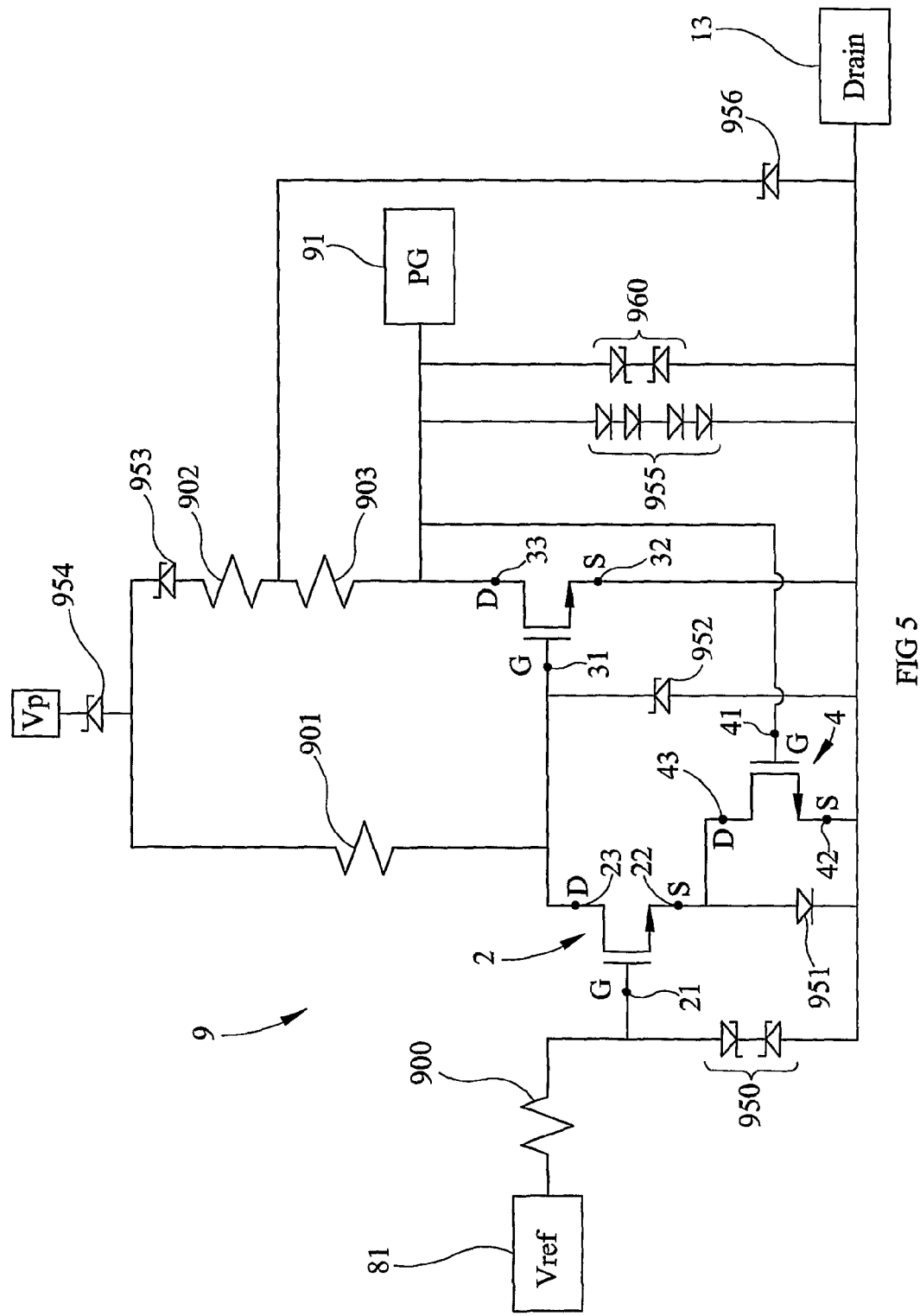
FIG. 5 is a circuit diagram of a part of a power good signal generating circuit for use in embodiments of the invention.

Referring now to FIG. 5, this is a schematic circuit diagram of part of a power good signal generating circuit for use in embodiments of the invention. For simplicity, resistors 900, 901 and 902 are shown as single components respectively, although in practice each of these may be formed from a plurality of resistors (e.g. poly resistors). The reference voltage generation circuit (not shown in the figure) generates a reference voltage 81 which is approximately 5 volts above the source potential of the vertical power MOSFET to which the circuit is connected. The power MOSFET source in this example is at 0 volts and $V_P$ is a constant positive supply, typically at 48 volts. Drain terminal 13 in the figure is connected so as to be at the potential of the drain of the power MOSFET. The bodies of each of the MOSFETs 2, 3, 4 shown in FIG. 5 are also arranged so as to be at, or near, drain 13 potential. These bodies may be portions of respective separate p-wells or respective portions of a common p-well. The reference voltage 81 is supplied via resister 900 to the gate 21 of a second MOSFET. The source 22 of this second MOSFET 2 is connected via a diode 951 to drain terminal 13. On the input side, there are gate protection diodes 950 to protect MOSFET 2 from excessive gate potentials. The function of second MOSFET 2 is thus to compare the reference voltage with the potential at the drain 13 of the power MOSFET. When that drain potential has fallen a threshold voltage plus diode drop 951 below the reference voltage 81, the second MOSFET 2 switches on, i.e. it is switched into a conductive state and the potential at its drain 23, which was high (by virtue of the connection to the supply voltage $V_P$ via resistor 901 and Zener diodes 954) goes low, that is it falls to a value close to the drain potential 13. The drain 23 of the second MOSFET is connected to the gate 31 of a third MOSFET, whose source 32 is connected to power MOSFET drain potential 13. Thus, when MOSFET 2 switches on its drain potential 23 goes low, the third MOSFET 3 is switched off, sending the potential on its drain 33 high. The potential at the drain 33 of the third MOSFET is the potential at the power good signal output terminal 91. A further array 955 of diodes and electrostatic discharge protection diodes 960 are connected between the power good signal output terminal 91 and the drain terminal 13. The function of these components is to limit the potential relative to the drain potential to a suitable value for a power good signal and to protect the pin from damaging external signals. The circuit is arranged such that the power good signal is 3 volts on terminal 91 relative to drain 13 when the power MOSFET to which the circuit is connected is capable of supplying the load. The potential of the drain 33 of the third MOSFET is provided to the gate 41 of a fourth MOSFET, whose source 42 is connected to the drain terminal 13. Thus when MOSFET 2 is on and MOSFET 3 is off, MOSFET 4 is also on. This shorts out diode 951 so that the drain voltage 13 needed to set the power good pin back to the low state is increased a diode voltage closer to Vp creating hysterisis. So when the power MOSFET begins to switch off, or is subjected to a short circuit, the power MOSFET's drain potential begins to rise and the power good signal goes low at a potential closer to Vp than previously. However, as the potential of the drain and the power MOSFET rises, MOSFET 4 and MOSFET 2 switch off, sending the potential at the drain 23 of the second MOSFET and hence the potential at the gate 31 of the third MOSFET high. This switches the third MOSFET from off to on, dropping the potential at the power good signal output terminal 91 down to drain 13 potential. Thus, when the power MOSFET is not fully conducting, the power good signal is 0 volts relative to drain 13. Other diodes such as zener diodes 956 and 952 prevent excessive voltages from damaging the low voltage components.

Figure 6:
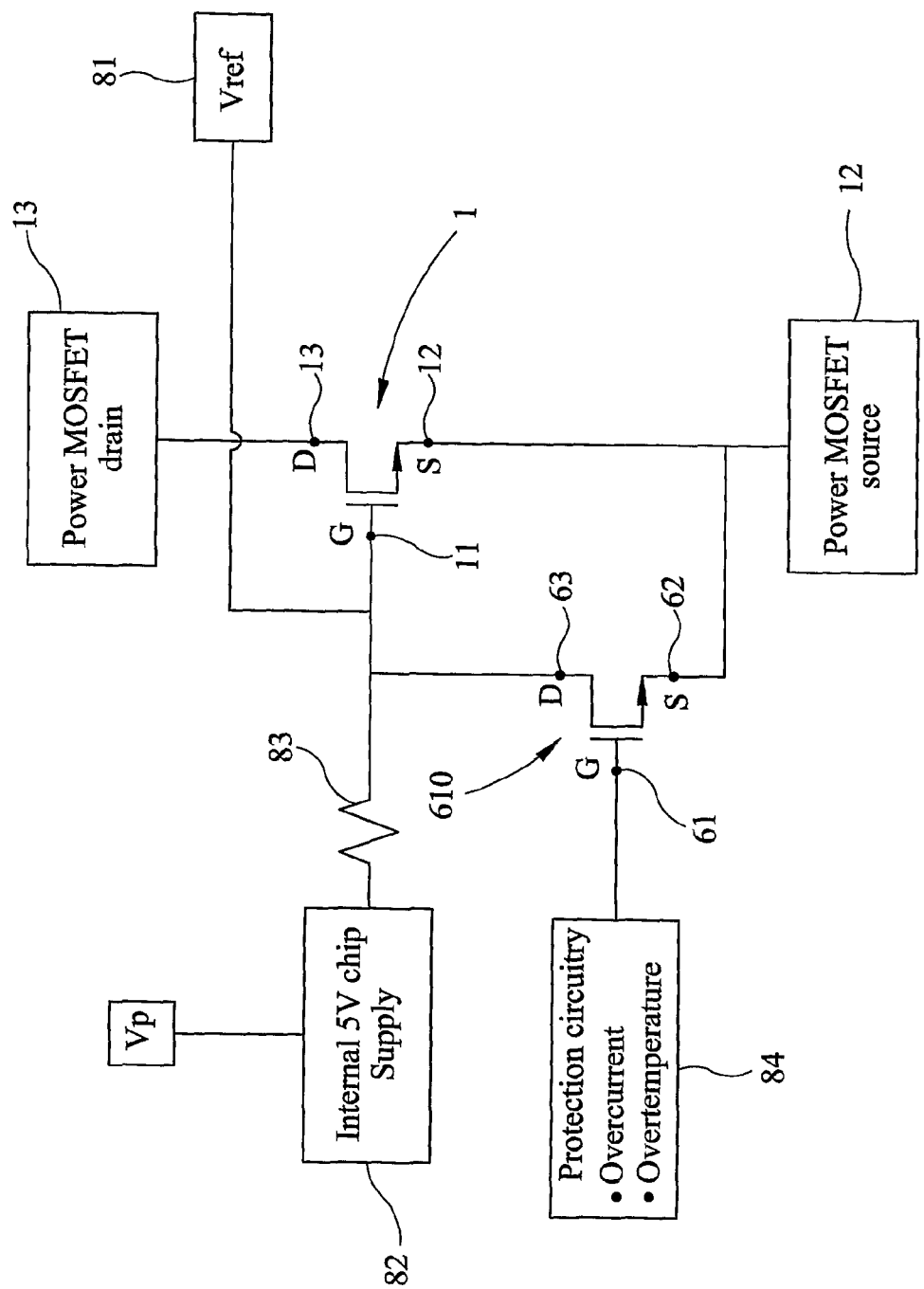
FIG. 6 is a schematic diagram of reference voltage generation circuitry for use in embodiments of the invention.

Referring now to FIG. 6, this illustrates reference voltage generation circuitry that is used in certain embodiments of the invention. The circuitry is shown in combination with the first MOSFET 1, which in this example is a vertical power MOSFET. Under normal conditions the circuitry generates a reference voltage 81 that is approximately 5V above the source voltage of the first MOSFET 1 (i.e. Vref is approximately 5V above the potential of the first source 12). The circuit is arranged such that the reference voltage 81 is the gate potential of the first MOSFET 1, which during normal operation is driven by a 5V gate drive. This gate drive is a substantially constant 5V generated from the supply voltage Vp by an internal 5V supply 82. This gate drive is supplied to gate 11 via resistor 83. The reference voltage generation circuitry also comprises protection circuitry 84 arranged to control a plurality of additional low voltage lateral MOSFETs 610 in response to detection of overcurrent and/or overtemperature conditions in the power supply circuitry. The drain 63 of each of these additional MOSFETs is connected to the gate 11 of the power MOSFET 1, and the source 62 of each is connected to the power MOSFET source 12. Thus, the plurality of additional MOSFETs 610 are connected in parallel between the gate 11 and source 12 of the power MOSFET 1. Although the circuit comprises a plurality of these additional MOSFETs 610, only one is shown in the figure for simplicity. The protection circuitry 84 controls the additional MOSFETs 610 by providing a drive to their gates 61. Under normal conditions, the drive to gates 61 is such that the MOSFETs 610 are in the off state, and the gate 11 of the first MOSFET is at substantially 5V. When an over temperature condition is detected, however, protection circuitry 84 drives a MOSFET 610 (or a group of the plurality of MOSFETS 610) into its on state, and hence its drain 63 and source 62 are then at substantially the same potential, namely that of the power MOSFET source 12. The first MOSFET is thus switched off (disabled) as its gate voltage is reduced below its threshold voltage. As the reference voltage 81 is tied to the gate 11 potential, it also drops (it falls to the same, low value). In examples where this reference voltage 81 is supplied to PG signal generation circuitry such as that shown in FIG. 5, when the protection circuitry has triggered Vref 81 to drop in this way, the drain potential of the first MOSFET 1 is then unable to achieve a low enough voltage to enable MOSFET 2 in FIG. 5 to enter conduction, and hence the PG output signal is low. The additional MOSFETs 610 may be integrated with the power MOSFET 1 in the manner illustrated by FIG. 4, that is with the additional MOSFETs 610 being located inside the power MOSFET depletion region. Thus, in embodiments of the invention, circuitry within the power MOSFET depletion region is able to turn off the power good potential located outside the power MOSFET depletion region.

Overcurrent protection is achieved via a feedback loop. Circuitry senses the vertical MOSFET current and, if it is excessive, reduces the vertical MOSFET gate current by using another of the lateral MOSFETs 610 (or another group of them) (i.e. by switching that MOSFET or group of MOSFETs on, to reduce the potential at the gate of the power MOSFET). This causes the drain voltage 13 to rise. When it is less than a threshold voltage below the reference voltage the PG pin output will switch from high to low indicating a fault condition. In this way, during overcurrent the device can both restrict the vertical MOSFET device current to a safe level and signal to the load that it should deactivate. It will be appreciated that in embodiments of the invention, the plurality of MOSFETs 610 can thus be controlled in response to a variety of fault conditions. Which of the plurality of MOSFETs 610 are switched on in response to a fault condition depends on the nature of the fault (e.g. overcurrent or overtemperature).

It will be appreciated from the above description that in certain embodiments the power good functionality is integrated within the channel stop region of a vertical MOSFET. Providing a drain referenced power good signal in a vertical smart MOSFET process provides this functionality without the expense of including high voltage IC elements. This technique allows a vertical smart MOSFET process to provide a drain referenced power good signal without the need for a co packaged high voltage MOSFET or internal high voltage IC elements, both of which would add cost.

Certain embodiments of the invention provide a power good signal relative to the drain of a vertical power MOSFET. This is useful when the power MOSFET load is an IC such as a dc-dc converter, in which case the ground for the IC is the power MOSFET drain. In the case of a dc-dc converter, it is beneficial to provide a power good (PG) signal only when the power MOSFET has switched fully into its on state. This prevents the IC load diverting current which would slow or prevent charging of line capacitances and proper turn on of the vertical MOSFET. The power MOSFET in certain embodiments is monolithically integrated with control circuitry forming a smart MOSFET. In some applications, such as POE, it includes UVLO (Under Voltage Lock Out) circuitry, in which case turning on the dc-dc converter before line capacitances are fully charged could have caused the supply voltage to drop low enough to switch off the power MOSFET, again creating an oscillating loop. By utilising the PG signal generated in embodiments of the invention, this problem can be avoided. Generation of a power good signal for a power supply incorporating a high voltage, vertical power MOSFET could be achieved with high voltage lateral transistors or co-packaged high voltage parts, but embodiments of the invention provide a more cost effective approach by combining a vertical power transistor with low voltage lateral components. A basic implementation may be as shown in FIG. 1, with the first MOSFET 1 being a vertical power MOSFET and second MOSFET being a low voltage lateral MOSFET.

The power MOSFET is fully switched on when its drain potential is within a few volts of its source potential. This is signalled by activating the open drain low voltage lateral MOSFET. So, for example, if the reference voltage is 5V then when the power MOSFET drain potential has fallen below (5-Vth) Volts (where Vth is the threshold voltage of the second MOSFET) the low voltage lateral MOSFET will switch on in response. This can be used to signal to the load that the system is ready. In this way a cost effective low voltage lateral MOSFET can be used to signal the readiness of a high voltage MOSFET. In the case of POE the high voltage power MOSFET can support 100V. The reference voltage is supplied by circuitry referenced to the power MOSFET source potential whilst the output signal is referenced to the power MOSFET drain potential. So, if the power MOSFET and lateral MOSFET are integrated on a common substrate (as shown in FIG. 4) at least one track needs to be run over the power MOSFET termination. Also, in a configuration such as that shown in FIG. 1 the gate of the lateral MOSFET has to support the off state Vds (drain source voltage) of the power MOSFET. This can be avoided by using protection diodes on the gate/source of the lateral MOSFET and a large resistor capable of supporting Vds connected to the reference voltage, as in the circuit shown in FIG. 5.

The open drain output shown in FIG. 1 is not ideal for many applications. For example, currently for POE it is preferable to have a positive signal of a few volts relative to the drain with hysteresis to signal power good, and a signal close to or at drain potential to signal power bad. This can be achieved by adding additional circuitry, as shown in FIG. 5, within the drain connected IC which in this case includes inverter stages, start up resistors and output signal hysteresis. These are all powered from the positive supply which, during the MOSFET's on state, is positive relative to the drain potential of the power MOSFET. The structure can be integrated, in the manner shown in FIG. 4.

Returning to FIG. 5, in this embodiment the reference voltage is about 5V where the power MOSFET source is at 0V, Vp is a constant positive supply, typically 48V, and drain 13 is the drain of the power MOSFET. When the drain voltage falls a Vth below the reference voltage the circuit generates a few volts with respect to the drain at the PG pin 91. This circuit, in certain embodiments is integrated into the drain of the power MOSFET, inverts the signal at the drain of the second MOSFET 2 and adds in hysterisis. The reference voltage generation means is arranged such that the reference voltage is switched to source voltage during fault conditions to prevent a good PG signal during a fault. It should be noted that this type of structure cannot operate with the power MOSFET drain more than a diode voltage below power MOSFET source because this forward biases the p type MOSFET body into the epitaxial layer 74 as for a conventional power MOSFET. In certain embodiments, the power supply circuit incorporating PG generation circuitry as shown in FIG. 5 is entirely composed of vertical power MOSFETs, lateral nmos devices, poly resistors, poly diodes, and variants thereof.

In certain embodiments, with integrated power and lateral MOSFETS, rather than the body of the second, lateral MOSFET being shorted to the drain of the power MOSFET, it may be provided by at least part of a well arranged outside the off state depletion region of the power MOSFET. This well may be isolated so that it is at a potential different from that of the power MOSFET drain. In other words, the power good signal generation circuitry may comprise one or a number of lateral MOSFETS with local body connections so that they are isolated by a few volts from the surrounding well for performance reasons. However, they are located in wells outside the off state depletion region of the power MOSFET. The integrated circuit may then further comprise a termination structure separating the first well from the second well or wells in which the bodies of these lateral devices are located.

The invention claimed is:

1. A power supply circuit comprising:
a first power supply rail;
a second power supply rail;
a first MOSFET having a gate, a source, a drain, and a body region between the source and drain, the body region being connected so as to be at the same potential as the source, and the source and drain being connected in series with the second power supply rail, the arrangement being such that application of a suitable potential to the gate is able to switch the MOSFET to an on state in which a conductive channel is opened in the body region between the source and drain to carry a power supply current through the first MOSFET; and
signal generation circuitry arranged to generate a signal indicative of a conductive state of the first MOSFET, the signal generation circuitry comprising reference voltage generation means connected to said source and arranged to generate a reference voltage, said reference voltage being a predetermined potential difference from the source potential, and a second MOSFET having a second gate, a second source, a second drain, and a second body region between the second source and second drain, the second body region being connected so as to be at the same potential as the drain of the first MOSFET, and the second gate being connected to receive said reference voltage, the arrangement being such that when the potential of the drain of the first MOSFET falls a predetermined voltage below the reference voltage the second MOSFET is switched to an on state in which a second conductive channel is opened in the second body region between the second source and the second drain, the signal being dependent upon the state of the second MOSFET.

2. A circuit in accordance with claim 1, wherein the first MOSFET is a vertical power MOSFET comprising a semiconductor structure having an upper surface and a lower surface, the source of the first MOSFET comprising a conductive contact to the upper surface and the drain of the first MOSFET comprising a conductive contact to the lower surface.

3. A circuit in accordance with claim 1, wherein the second MOSFET is a lateral MOSFET comprising a second semiconductor structure having an upper surface and a lower surface, the source and the drain of the second MOSFET each comprising a respective conductive contact to the upper surface of the second semiconductor structure.

4. A circuit in accordance with claim 1, wherein the first and second MOSFETS are integrated on a common substrate.

5. A circuit in accordance with claim 4, wherein the common substrate has an upper surface and a lower surface and comprises:
a semiconductor substrate of a first conductivity type, a lower surface of the semiconductor substrate being the lower surface of the common substrate;
an epitaxial layer of semiconductor material of the first conductivity type formed on the semiconductor substrate;
a first well of semiconductor material of a second conductivity type extending from the upper surface of the common substrate into the epitaxial layer;
a second well of semiconductor material of said second conductivity type extending from the upper surface of the common substrate into the epitaxial layer, said second well being separate from said first well;
wherein the first MOSFET is a vertical power MOSFET, the source of the first MOSFET comprising a conductive contact to the upper surface of the common substrate arranged to contact the first well and at least one source region of semiconductor material of said first conductivity type extending from the upper surface into the first well, the drain of the first MOSFET comprising a conductive contact to the lower surface of the semiconductor substrate, and the body region of the first MOSFET comprising at least a portion of the first well;
and wherein the second MOSFET is a lateral MOSFET, the source of the second MOSFET comprising a conductive contact to the upper surface of the common substrate arranged to contact a second source region of semiconductor material of said first conductivity type extending from the upper surface into the second well, the drain of the second MOSFET comprising a conductive contact to the upper surface of the common substrate arranged to contact a drain region of semiconductor material of said first conductivity type extending from the upper surface into the second well, and wherein the second body region of the second MOSFET comprises at least part of said second well.

6. A circuit in accordance with claim 5, wherein the first well is formed within an off state depletion region of the first MOSFET such that the surrounding semiconductor material of the first conductivity type is substantially at the source potential of the first MOSFET, and the second well is formed outside the off state depletion region of the first MOSFET such that the surrounding semiconductor material of the first conductivity type is substantially at the drain potential of the first MOSFET.

7. A circuit in accordance with claim 6, comprising a plurality of said first wells and a plurality of said second wells.

8. A circuit in accordance with claim 5, further comprising a termination structure arranged to prevent formation of a conductive channel between the first and second wells.

9. A circuit in accordance with claim 8, wherein the termination structure comprises a channel stop region of semiconductor material of said first conductivity type extending from the upper surface of the common substrate into the epitaxial layer and arranged so as to separate the first and second wells.

10. A circuit in accordance with claim 9, further comprising a short arranged to electrically connect the channel stop region to the second well or to at least one of the plurality of second wells.

11. A circuit in accordance with claim 8, wherein the termination structure comprises a field plate arranged over the upper surface of the common substrate so as to overlap an edge portion of the first well or an edge portion of at least one of the plurality of first wells.

12. A circuit in accordance with claim 5, further comprising gate control circuitry arranged to control the potential applied to the gate of the first MOSFET, the gate control circuitry comprising at least one gate control MOSFET integrated on said common substrate, said gate control MOSFET being a lateral MOSFET comprising a gate, a source, a drain, and a body region between the source and drain, the source of the gate control MOSFET comprising a conductive contact to the upper surface of the common substrate arranged to contact a respective source region of semiconductor material of said first conductivity type extending from the upper surface into the first well, the drain of the gate control MOSFET comprising a conductive contact to the upper surface of the common substrate arranged to contact a respective drain region of semiconductor material of said first conductivity type extending from the upper surface into the first well, and wherein the body region of the gate control MOSFET comprises a portion of said first well or a portion of one of said plurality of first wells.

13. A circuit in accordance with claim 5, wherein the signal generation circuitry comprises at least one further lateral MOSFET having a body region connected so as to be at the same potential as the drain of the first MOSFET and wherein the or each further lateral MOSFET is integrated on the common substrate, and the body region of the or each further lateral MOSFET comprises a respective portion of the second well or of one of the plurality of second wells.

14. A circuit in accordance with claim 1, wherein the signal generation circuitry comprises at least one further lateral MOSFET having a body region connected so as to be at the same potential as the drain of the first MOSFET.

15. A circuit in accordance with claim 14, wherein the at least one further lateral MOSFET comprises a third MOSFET having a drain connected to the first supply rail via at least one resistor and a source connected so as to be at the potential of the drain of the first MOSFET, the third MOSFET being further connected such that it is switched off in response to the second MOSFET switching on, and wherein said signal is a voltage at the drain of the third MOSFET.

16. A circuit in accordance with claim 1, and further comprising a power supply arranged to provide a DC voltage of at least 30V between the first and second power supply rails.

17. A circuit in accordance with claim 16 wherein the power supply is incorporated in a server or a computer.

18. A circuit in accordance with claim 1, further comprising means for connecting an Ethernet cable to the first power supply rail, the drain of the first MOSFET, and to a signal output terminal on which the signal is provided, whereby power and said signal may be provided to a device connected to the circuit via an Ethernet cable.

19. A circuit in accordance with claim 1, in combination with a device arranged to be powered from the power supply rails, the device being connected to the first power supply rail and to the drain of the first MOSFET such that power supply current is supplied to the device through the first MOSFET, and the device being connected to receive said signal, the device having an operational state in which it draws power supply current from the rails and a non-operational state in which it draws at least reduced current from the rails, the device being arranged so as to be dependent upon said signal to switch from the non-operational to the operation state.

20. A power supply circuit and device combination in accordance with claim 19, wherein the device is a DC to DC converter.

21. An integrated circuit comprising:
a common substrate having an upper surface and a lower surface and comprising a semiconductor substrate of a first conductivity type, a lower surface of the semiconductor substrate being the lower surface of the common substrate, and an epitaxial layer of semiconductor material of the first conductivity type formed on the semiconductor substrate;
a first well of semiconductor material of a second conductivity type extending from the upper surface of the common substrate into the epitaxial layer;
a second well of semiconductor material of said second conductivity type extending from the upper surface of the common substrate into the epitaxial layer, said second well being separate from said first well;
a first MOSFET having a gate, a source, a drain, and a body region between the source and drain, the body region being connected so as to be at the same potential as the source;
a second MOSFET having a second gate, a second source, a second drain, and a second body region between the second source and second drain, the second body region being connected so as to be at substantially the same potential as the drain of the first MOSFET,
wherein the first MOSFET is a vertical power MOSFET, the source of the first MOSFET comprising a conductive contact to the upper surface of the common substrate arranged to contact the first well and at least one source region of semiconductor material of said first conductivity type extending from the upper surface into the first well, the drain of the first MOSFET comprising a conductive contact to the lower surface of the semiconductor substrate, and the body region of the first MOSFET comprising at least a portion of the first well;
and wherein the second MOSFET is a lateral MOSFET, the source of the second MOSFET comprising a conductive contact to the upper surface of the common substrate arranged to contact a second source region of semiconductor material of said first conductivity type extending from the upper surface into the second well, the drain of the second MOSFET comprising a conductive contact to the upper surface of the common substrate arranged to contact a drain region of semiconductor material of said first conductivity type extending from the upper surface into the second well, and wherein the second body region of the second MOSFET comprises at least part of said second well.

22. An integrated circuit in accordance with claim 21, wherein the first well is formed within an off state depletion region of the first MOSFET such that the surrounding semiconductor material of the first conductivity type is substantially at the source potential of the first MOSFET, and the second well is formed outside the off state depletion region of the first MOSFET such that the surrounding semiconductor material of the first conductivity type is substantially at the drain potential of the first MOSFET.

23. An integrated circuit in accordance with claim 21, further comprising a termination structure arranged to prevent formation of a conductive channel between the first and second wells.

24. An integrated circuit comprising:
a common substrate having an upper surface and a lower surface and comprising a semiconductor substrate of a first conductivity type, a lower surface of the semiconductor substrate being the lower surface of the common substrate, and an epitaxial layer of semiconductor material of the first conductivity type formed on the semiconductor substrate;
a first well of semiconductor material of a second conductivity type extending from the upper surface of the common substrate into the epitaxial layer;
a second well of semiconductor material of said second conductivity type extending from the upper surface of the common substrate into the epitaxial layer, said second well being separate from said first well;
a first MOSFET having a gate, a source, a drain, and a body region between the source and drain, the body region being connected so as to be at the same potential as the source;
a second MOSFET having a second gate, a second source, a second drain, and a second body region between the second source and second drain, wherein the first MOSFET is a vertical power MOSFET, the source of the first MOSFET comprising a conductive contact to the upper surface of the common substrate arranged to contact the first well and at least one source region of semiconductor material of said first conductivity type extending from the upper surface into the first well, the drain of the first MOSFET comprising a conductive contact to the lower surface of the semiconductor substrate, and the body region of the first MOSFET comprising at least a portion of the first well;

and wherein the second MOSFET is a lateral MOSFET, the source of the second MOSFET comprising a conductive contact to the upper surface of the common substrate arranged to contact a second source region of semiconductor material of said first conductivity type extending from the upper surface into the second well, the drain of the second MOSFET comprising a conductive contact to the upper surface of the common substrate arranged to contact a drain region of semiconductor material of said first conductivity type extending from the upper surface into the second well, and wherein the second body region of the second MOSFET comprises at least part of said second well, and wherein the first well is formed within an off state depletion region of the first MOSFET, and the second well is formed outside the off state depletion region of the first MOSFET.

* * * * *